US009355985B2

(12) United States Patent
Vincent et al.

(10) Patent No.: US 9,355,985 B2
(45) Date of Patent: May 31, 2016

(54) MICROELECTRONIC PACKAGES HAVING SIDEWALL-DEPOSITED HEAT SPREADER STRUCTURES AND METHODS FOR THE FABRICATION THEREOF

(71) Applicants: Michael B. Vincent, Chandler, AZ (US); Scott M. Hayes, Chandler, AZ (US)

(72) Inventors: Michael B. Vincent, Chandler, AZ (US); Scott M. Hayes, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 1 day.

(21) Appl. No.: 14/291,547

(22) Filed: May 30, 2014

(65) Prior Publication Data

US 2015/0348865 A1 Dec. 3, 2015

(51) Int. Cl.

| | |
|---|---|
| ***H01L 23/367*** | (2006.01) |
| ***H01L 23/00*** | (2006.01) |
| ***H01L 23/31*** | (2006.01) |
| ***H01L 21/56*** | (2006.01) |
| ***H01L 23/36*** | (2006.01) |
| *H01L 23/433* | (2006.01) |

(52) U.S. Cl.

CPC ................ *H01L 24/32* (2013.01); *H01L 21/56* (2013.01); *H01L 23/3128* (2013.01); *H01L 23/36* (2013.01); *H01L 23/3677* (2013.01); *H01L 24/03* (2013.01); *H01L 24/09* (2013.01); *H01L 24/27* (2013.01); *H01L 24/83* (2013.01); *H01L 21/568* (2013.01); *H01L 23/4334* (2013.01); *H01L 2224/0231* (2013.01); *H01L 2224/0237* (2013.01); *H01L 2224/2731* (2013.01); *H01L 2224/32175* (2013.01); *H01L 2224/8384* (2013.01)

(58) Field of Classification Search

CPC .............. H01L 23/367; H01L 23/3672; H01L 23/3677

See application file for complete search history.

(56) References Cited

U.S. PATENT DOCUMENTS

| | | | | |
|---|---|---|---|---|
| 5,158,912 | A | 10/1992 | Kellerman et al. | |
| 5,216,283 | A * | 6/1993 | Lin | H01L 23/10 257/708 |
| 5,986,885 | A | 11/1999 | Wyland | |
| 6,236,116 | B1 * | 5/2001 | Ma | 257/796 |
| 8,237,252 | B2 | 8/2012 | Pagaila et al. | |
| 2001/0045644 | A1 * | 11/2001 | Huang | 257/718 |
| 2006/0049995 | A1 * | 3/2006 | Imaoka et al. | 343/702 |
| 2006/0172457 | A1 * | 8/2006 | Huang | 438/106 |
| 2008/0315398 | A1 | 12/2008 | Lo et al. | |
| 2010/0084761 | A1 * | 4/2010 | Shinagawa | 257/706 |
| 2010/0109137 | A1 * | 5/2010 | Sasaki et al. | 257/684 |
| 2011/0182546 | A1 * | 7/2011 | Yasuda et al. | 385/31 |
| 2011/0260303 | A1 | 10/2011 | Pagaila et al. | |
| 2012/0171814 | A1 * | 7/2012 | Choi et al. | 438/107 |
| 2012/0305063 | A1 * | 12/2012 | Moslehi et al. | 136/256 |
| 2013/0147026 | A1 | 6/2013 | Topacio et al. | |

(Continued)

FOREIGN PATENT DOCUMENTS

WO WO 2013095457 A1 * 6/2013

*Primary Examiner* — Joseph C Nicely

(57) ABSTRACT

Microelectronic packages and methods for producing microelectronic packages having sidewall-deposited heat spreader structures are provided. In one embodiment, the method includes providing a package body containing a microelectronic device. A heat spreader structure is printed or otherwise formed over at least one sidewall of the package body. The heat spreader structure is thermally coupled to the microelectronic device and is configured to dissipate heat generated thereby during operation of the microelectronic package.

20 Claims, 6 Drawing Sheets

20 36 56 56 68 60 62 54 74 72 26 28 32 72 74 54 64 50 52 22 70 70 68 76 58 34 44 76 24 30 38 Z X Y 40 46 48 48 46 40 42 60

(56) References Cited

U.S. PATENT DOCUMENTS

2014/0199806 A1* 7/2014 Lennon et al. .................. 438/98
2014/0327129 A1* 11/2014 Cho et al. ...................... 257/713
2015/0137345 A1* 5/2015 Choi et al. .................... 257/713

* cited by examiner

MICROELECTRONIC PACKAGES HAVING SIDEWALL-DEPOSITED HEAT SPREADER STRUCTURES AND METHODS FOR THE FABRICATION THEREOF

TECHNICAL FIELD

Embodiments of the present invention relate generally to microelectronic packaging and, more particularly, to microelectronic packages having sidewall-deposited heat spreader structures, as well as to methods for the fabrication thereof.

BACKGROUND

High performance semiconductor die can generate excess heat during operation. Efficient heat dissipation may thus be important to ensure proper functioning of the die. In instances wherein a semiconductor die is encapsulated within a surrounding dielectric material having a relatively low thermal conductivity, such as when the semiconductor die is encapsulated utilizing a Fan-Out Wafer Level Packaging (FO-WLP) approach, heat dissipation from the die may be reduced by the surrounding encapsulant. In certain instances, thermal performance of the package can be improved by placing the backside of the die in thermal contact with a heat sink structure, such as a copper slug, exposed to the ambient environment. In instances wherein the microelectronic package includes multiple package layers bonded in a stacked relationship, however, the overlying package layer or layers can obstruct attachment of the copper slug to any semiconductor die contained within the underlying package layer. Furthermore, the overlying package layer will typically cover most, if not all, of the copper slug if attached to the die backside and thus interfere with the convective cooling thereof. As a still further drawback, positioning a copper slug between stacked package layers can result in undesired heating of any microelectronic components contained within the overlying package layer, which may have thermal tolerances less than that of the heat-generating die contained within the underlying package layer. Package performance can suffer as a result.

There thus exists an ongoing need to provide microelectronic packages and methods for fabricating microelectronic packages having improved heat dissipation capabilities. Ideally, embodiments of the microelectronic package would provide enhanced thermal performance even when containing multiple package layers bonded in a stacked relationship, one or more of which are encapsulated utilizing a FO-WLP approach. It would also be desired if, in at least some embodiments, the package fabrication method could be performed on a panel level, at least in substantial part, to optimize manufacturing efficiency and throughput. Other desirable features and characteristics of embodiments of the present invention will become apparent from the subsequent Detailed Description and the appended Claims, taken in conjunction with the accompanying drawings and the foregoing Background.

BRIEF DESCRIPTION OF THE DRAWINGS

At least one example of the present invention will hereinafter be described in conjunction with the following figures, wherein like numerals denote like elements, and.

Figure 1:
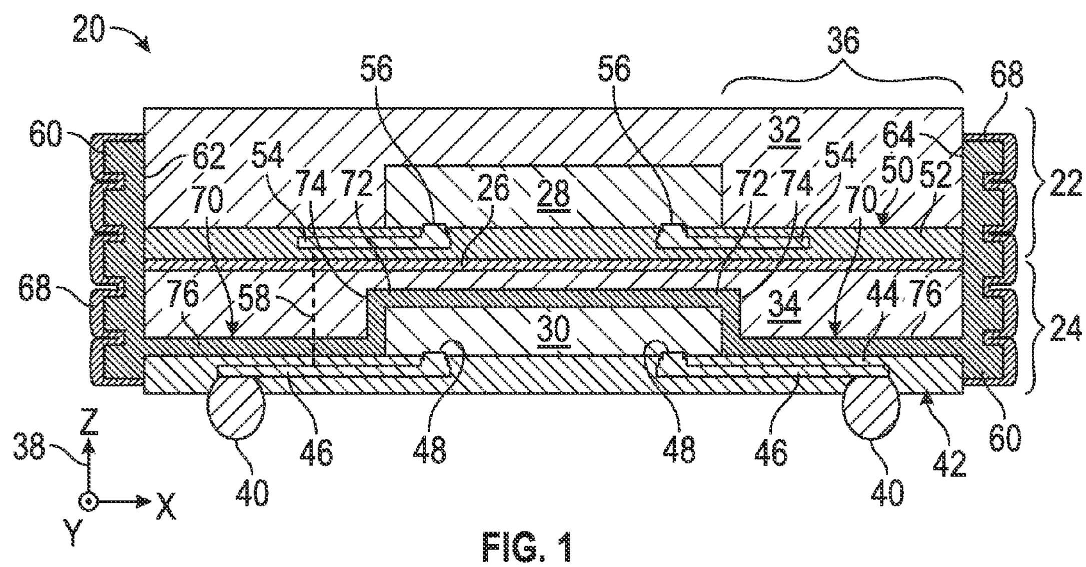
FIGS. 1 and 2 are simplified cross-sectional and side views of a stacked, multi-layer microelectronic package having sidewall-deposited heat spreader structures and embedded thermal conduits, which are conformally deposited over a packaged die prior to encapsulation thereof, as illustrated in accordance with an exemplary embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following describes microelectronic packages and methods for fabricating microelectronic packages including heat spreader structures, which are printed or otherwise deposited onto the package sidewalls to enhance heat dissipation during usage of the package. The heat spreader structures are advantageously produced to cover relatively large regions of one or more package sidewalls and thereby provide a relatively large cumulative surface area for convective heat transfer from the microelectronic package to the ambient environment. In certain embodiments, the convectively-cooled surfaces of the heat spreader structures are further enlarged by fabricating the structures to include ridge- or pin-shaped projections, such as fins or spars; and/or by depositing a porous coating over the outer surfaces of the heat spreader structures. If desired, dedicated thermal conduits can also be embedded within the microelectronic package to promote conductive heat transfer from the semiconductor die (or other heat-generating components) contained within the package body to the heat spreader structures bonded to the package sidewalls. In this case, the embedded thermal conduits can be patterned to include enlarged regions overlying portions of die prone to excess heat generation (more informally, die "hot spots"), to avoid electrical bridging to other microelectronic components or interconnect structures within the package, or to preferentially route the conduits through other thermally-conductive structures contained within the package, such as an embedded ground plane. By incorporating such features into the microelectronic package, the thermal performance of the package can be significantly improved.

While not limited to integration into a specific type of microelectronic package, the sidewall-deposited heat spreader structures and the embedded thermal conduits described herein are usefully incorporated into three dimensional or stacked microelectronic packages containing multiple package layers bonded in a stacked relationship (also commonly referred to as a "Package-on-Package" or "PoP" device). In such implementations, one or more of the package layers can contain semiconductor die or other microelectronic components encapsulated utilizing a FO-WLP approach. As described above, such packages often suffer from relatively poor heat dissipation capabilities due, at least in part, to the stacked relationship of the package layers and the thermally-insulative nature of the encapsulant or overmold material in which the microelectronic components are embedded. For this reason, the following description will focus primarily on exemplary embodiments of microelectronic packages containing multiple package layers, which are bonded in a stacked relationship and which contain microelectronic devices encapsulated utilizing a FO-WLP approach. It is emphasized, however, that the microelectronic package need not include multiple package layers in all embodiments; and, in embodiments wherein the microelectronic package includes multiple layers, the package layers can be produced utilizing various different types of packaging approaches, including Fan-In Wafer Level Packaging (FI-WLP) or Chip Scale Packaging (CSP) approaches.

FIG. 1 is a simplified cross-sectional view of a microelectronic package 20, as illustrated in accordance with an exemplary embodiment of the present invention. Microelectronic package 20 contains a package body 22, 24 including an upper package layer 22 and a lower package layer 24; the terms "upper" and "lower" utilized herein with reference to illustrated orientation of package 20 in FIG. 1 and with the understanding that package 20 can assume any orientation in three dimensional space during usage. Package layers 22 and 24 are bonded in stacked relationship by an intervening adhesive layer 26, such as a layer of die attach material. Package layers 22 and 24 can contain any number and type of microelectronic devices. In the embodiment shown in FIG. 1, package layers 22 and 24 contain first and second semiconductor die 28 and 30, respectively, which are embedded within encapsulant or overmold layers 32 and 34. Package layers 22 and 24 are produced utilizing a FO-WLP approach such that overmold layers 32 and 34 include fan-out regions extending around semiconductor die 28 and 30, respectively. The right half of the fan-out region of overmold layer 32 (as considered in the illustrated cross-section) is identified by bracket "36" in FIG. 1. In further embodiments, a different packaging approach, such as a FI-WLP approach, can be utilized to produce one or both of package layers 22 and 24.

A Ball Grid Array (BGA) including a number of solder balls 40 is formed over the frontside of microelectronic package 20. Any suitable interconnect feature or combination of interconnect features can be utilized to provide the desired interconnections between BGA solder balls 40, die 28, die 30, and any other microelectronic components contained within package 20. In the illustrated embodiment, one or more Redistribution Layers (RDLs) are built-up over the respective frontsides of package layers 22 and 24 to provide the desired interconnections. More specifically, one or more RDLs 42 are formed over frontside 44 of lower package layer 24 and contain a number of electrically-conducive interconnect lines 46, which electrically coupled bond pads 48 of semiconductor die 30 to BGA solder balls 40. Similarly, one or more RDLs 50 are formed over frontside 52 of upper package layer 22 and contain a plurality of interconnect lines 54 electrically coupled to bond pads 56 of die 28. Interconnect lines 54 also electrically couple bond pads 56 of die 28 to solder balls 40; however, the electrical connections between die 28 and solder balls 40 can also be formed by other interconnect features included within package 20, which are not shown in FIG. 1 for clarity. One such electrical path is represented in FIG. 1 by dashed line 58 and can be formed, at least in part, by a non-illustrated through package via and an interconnect line 54 included within upper RDLs 50. In further embodiments, microelectronic package 20 can be produced to include another type of Input/Output (I/O) interface and associated interconnect structures, which can include any combination of contact arrays (e.g., BGAs, Land Grid Arrays, bond pads, stud bumps, etc.), RDLs, leadframes, interposers, wire bonds, through package vias, and the like. In still further embodiments, package 20 need not include externally-accessible points-of-contact and can instead communicate wirelessly via an antenna structure, while being powered by an internal battery or energy harvesting.

For the purposes of the present description, it can be assumed that semiconductor die 30 generates undesirably large quantities of heat during operation. If not adequately dissipated, the excess heat can negatively impact the performance of semiconductor die 30 and, perhaps, any neighboring components contained within package 20. For example, excess heat generated by semiconductor die 30 could potentially affect semiconductor die 28, which can be a memory die having a relatively low thermal tolerance. Heat dissipation from the frontside and periphery of semiconductor die 30 is, however, largely prevented by RDLs 42 and the fan-out region of overmold layer 30, which is typically composed of a thermally-insulative dielectric material. Similarly, heat dissipation from the backside of semiconductor die 30 through the backside of microelectronic package 20 (the upper surface of package 20 in the illustrated orientation) is impeded by upper package layer 22. Furthermore, the ability of package 20 to dissipate large quantities of heat generally cannot be improved, in any significant respect, by attaching a copper slug or other heat sink structure to the backside of die 30 due to the presence of upper package layer 22. In accordance with embodiments of the present invention, the technical challenge of improving heat dissipation from microelectronic package 20 is overcome by integrating unique heat dissipating structures into package 20. These features include heat spreader structures, which are deposited over package sidewalls of package 20 and thermally coupled to die 30 (or to any other heat-generating components contained within package 20) to enhance convective heat release to the ambient environment, as described below. Additionally, in preferred embodiments, dedicated thermal conduits are embedded in microelectronic package 20 to promote conductive heat transfer from die 30 to the sidewall-deposited heat spreader, as further described below.

With continued reference to the exemplary embodiment shown in FIG. 1, microelectronic package 20 is produced to include two heat spreader structures 60, which are deposited on opposing sidewalls 62 and 64 of package body 22, 24. In further embodiments wherein package 20 has a square or rectangular planform shape, heat spreader structures 60 can be formed on three or, perhaps, on all four sidewalls of microelectronic package 20, in which case neighboring structures 60 may or may not contact near the corners of package 20. Additionally, multiple heat spreader structures 60 can be formed on a single package sidewall; and/or one or more heat spreader structures 60 can be produced on the backside of package 20 opposite BGA 40. Heat spreader structures 60 can be formed from any thermally-conductive material amenable to selective deposition onto package sidewalls 62 and 64. Heat spreader structures 60 are preferably deposited directly on or in intimate contact with package sidewalls 62 and 64; however, the possibility that one or more intervening layers, such as a bond coat, can first be deposited on the package sidewalls prior to deposition of structures 60 is not precluded.

In embodiments wherein heat spreader structures 60 are deposited directly onto sidewalls 62 and 64, the thermally-conducive material from which structures 60 are formed is preferably capable of forming a sufficiently strong mechanical bond with the package sidewalls to prevent separation or spall of structures 60 during usage of package 24. Suitable materials include, but are not limited to, plated metals, particle-filled inks, electrically-conductive polymers, solder pastes, solder-filled adhesives, and metal-containing adhesives or epoxies, such as silver-, nickel-, and copper-filled epoxies. In one embodiment, heat spreader structures 60 are composed of a printable ink containing metal nanoparticles, which are sintered after deposition in the manner described below in conjunction with FIG. 8. Finally, in certain cases, heat spreader structures 60 can be produced from a material having a relatively high porosity to impart structures 60 with an open-celled microstructure containing numerous linked voids or cavities promoting fluid flow and thereby increase enthalpy or otherwise improve heat exchange during usage of package 20.

Figure 2:
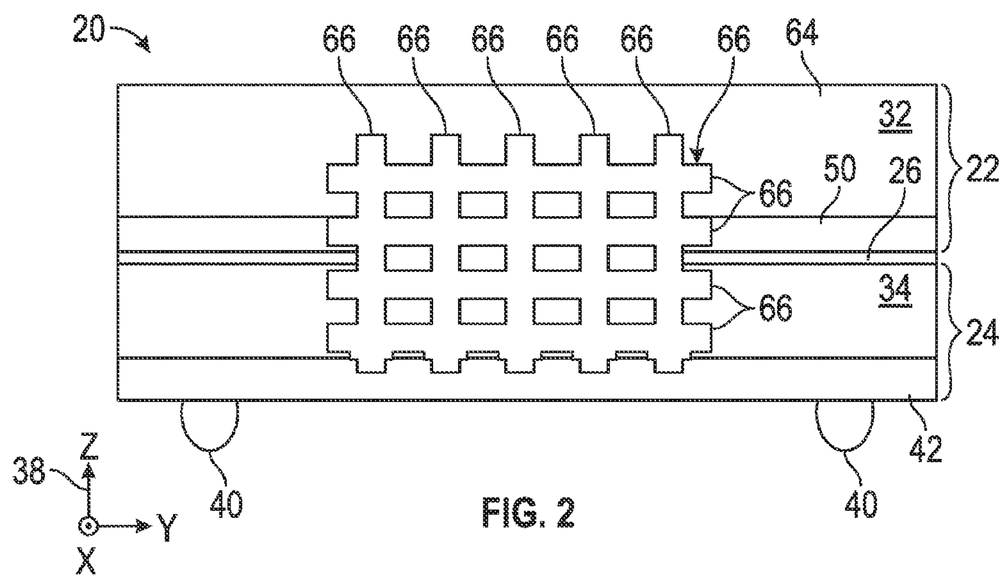

Heat spreader structures 60 are advantageously formed to have relatively large external surface areas to promote convective heat transfer from structures 60 to the ambient environment. The external surface areas of heat spreader structures 60 can be maximized by producing structures 60 to cover relatively large regions of the package sidewalls. For example, in many embodiments, heat spreader structures 60 can be produced to cover at least 25% of the surface area of the respective sidewalls 62 and 64 onto which structures 60 are deposited. As shown in FIG. 1, heat spreader structures 60 can be formed in contact with both package layers 22 and 24 and, more specifically, in contact with external surfaces of the fan-out regions of overmold layers 32 and 34 partially defining the package sidewalls. Thus, in further embodiments, heat spreader structures 60 can also be utilized to provide a ground connection between overlying package layers 22 and 24 or to provide a Radio Frequency (RF) interference shield or other microelectronic component disposed on the frontside of package 20. In addition to maximizing sidewall area covered by heat spreader structures 60, the convectively-cooled surfaces of heat spreader structures 60 can also be enlarged by fabricating structures 60 to include a number of projections, such as a series of pin- or fin-like features, which extend outwardly from sidewalls 62 and 64 in lateral directions. This may be more fully appreciated by referring to FIG. 2, which is a side view of microelectronic package 20 illustrating one of heat spreader structures 60 in greater detail. As can be seen, heat spreader structures 60 has been fabricated to include a number of fins or spars 66, which project outwardly from the main body of structure 60 and which intersect to form lattice or grid-like pattern. In further embodiments, spars 66 can be formed to have other geometries and arrangements, such as those described below in conjunction with FIGS. 9 and 10.

Further enhancements in the convective cooling of heat spreader structures 60 can be achieved by depositing a porous coating 68 (FIG. 1) over exterior surfaces of structures 60. This too effectively increases the surface area available for convective cooling, albeit on the surface morphology level of coating itself. Porous coating 68 can be composed of a material have a relatively high thermal conductivity (e.g., a thermal conductivity exceeding and, preferably, at least twice the thermal conductivity of the encapsulant from which overmold layers 32 and 34 are formed). Additionally, porous coating 68 is composed of a material having a porosity exceeding and, preferably, at least twice the porosity of the parent material of heat spreader structures 60. Furthermore, due to the increased porosity of the coating material as compared to the heat spreader parent material, porous coating 68 can have a surface area at least twice the surface area of the regions of structures 60 covered by coating 68 in certain implementations. In one embodiment, porous coating 68 is formed by first dispensing a layer of silver oxalate over heat spreader structures 60 and then sintering the silver oxalate layer to produce the desired porous morphology, as described below in conjunction with FIG. 8. Porous coating 68 is preferably formed to have a thickness of about 0.5 to about 5 microns (μm); however, the thickness of porous coating 68 can be greater than or less than the aforementioned range in further embodiments.

One or more thermal conduits 70 can be embedded within microelectronic package 20 to promote conductive heat flow from semiconductor die 30 (and, perhaps, from additional heat-generating components contained within package 20) to heat spreader structures 60. Embedded thermal conduits 70 extend between semiconductor die 30 to heat spreader structures 60 and are preferably formed in physical contact with both die 30 and structures 60. In the exemplary embodiment shown in FIG. 1, specifically, embedded thermal conduits 70 are each formed to include a first region 72, which extends over and contacts the backside of semiconductor die 30; a second region 74, which extends over a sidewall of die 30; and a third region 76, which extends laterally away from die 30, along the fan-out region of molded body 34, and to heat spreader structure 60. Thermal conduits 70 can assume the form of one or more structure or bodies having relatively high thermal conductivities as compared to the thermal conductivity of the encapsulant from which overmold layers 32 and 34 are composed. Thermal conduits 70 can be formed from the same material utilized to produce heat spreader structures 60. For example, embedded thermal conduits 70 can be produced as a number of elongated thermally-conductive lines or traces, which are formed from thermally-conductive ink dispensed utilizing a three dimensional printing process, as described more fully below in conjunction with FIGS. 3 and 4. In this case, as shown in FIG. 1, thermal conduits 70 can be produced as a patterned layer conformal to die 30 and to frontside of overmold layer 34. In further embodiments, other deposition process, such as metal plating or screen printing, can be utilized to produce the embedded thermal conduits as described below in conjunction with FIGS. 11 and 12.

Fabrication of microelectronic package 20 can be carried-out, at least in part, on a panel level to allow a number of other microelectronic packages to be produced in parallel with package 20 thereby increasing manufacturing efficiency and throughput. An exemplary embodiment of a manufacturing method suitable for producing microelectronic package 20 along with a number of other microelectronic packages will now be described in conjunction with FIGS. 3-8. As shown in FIGS. 3-8 and described further below, the fabrication method is offered by way of non-limiting example only. It is emphasized that the fabrication steps shown in FIGS. 3-8 can be performed in alternative orders, that certain steps may be omitted in alternative embodiments, and that additional steps may be performed in alternative embodiments. Description of structure and processes known within the semiconductor industry may be limited or entirely omitted without providing the well-known process details. Furthermore, while described below in conjunction with the production of a particular type of microelectronic package (i.e., microelectronic package 20 shown in FIGS. 1 and 2), it is emphasized that the below-described processing steps can be performed to produce microelectronic packages that vary in structure and function as compared to package 20.

Figure 3:
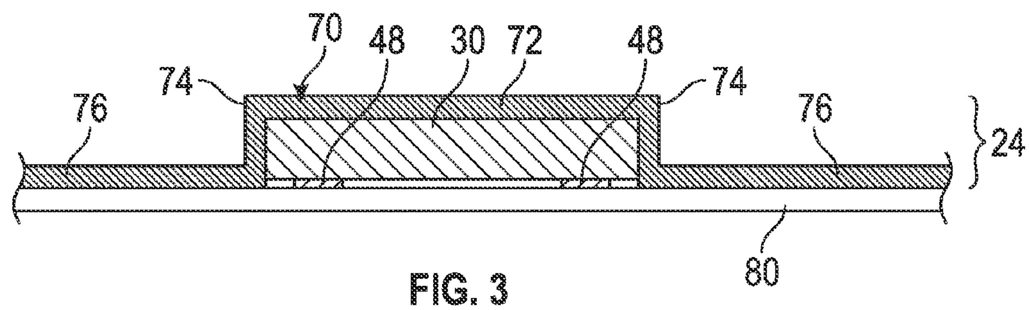
FIGS. 3-8 illustrate the microelectronic package shown in FIGS. 1 and 2 at various stages of completion and produced in accordance with an exemplary fabrication method.

During fabrication of microelectronic package 20 (FIGS. 1 and 2), separate molded panels are produced containing package layers 22 and 24 in a pre-singulated form. The following will describe production of the molded panel containing lower package layer 24, but is equally applicable to the production of the molded panel containing upper package layer 22 (with the exception of the steps relating to the production of thermal conduits 70). Panelization generally commences with the placement of die 30 on a temporary substrate over which a number of other semiconductor die and, perhaps, other microelectronic devices are also distributed. For example, as shown in FIG. 3, semiconductor die 30 may be inverted and placed facedown on a temporary substrate 80 using, for example, a pick-and-place tool such that bond pads 48 of die 30 contact the upper surface of substrate 80. Only a relatively small portion of temporary substrate 80 supporting semiconductor die 30 is shown in FIG. 3 to avoid unnecessarily cluttering the drawings. However, it will be appreciated that temporary substrate 80 will typically be considerably larger than the illustrated portion, and a relatively large number of semiconductor die can be distributed over the upper surface of substrate 80 in a grid array or other spatial arrangement along with the illustrated die 30. Temporary substrate 80 can be any body, structure, or platform suitable for supporting die 30 and the other non-illustrated semiconductor die during the below-described encapsulation or panelization process. In one embodiment, substrate 80 is a taped mold frame.

Thermal conduits 70 are now formed over temporary substrate 80, semiconductor die 30, and the other non-illustrated die distributed across substrate 80. Thermal conduits 70 can be produced from various different materials having thermal conductivies exceeding that of the material from which overmold layers 32 and 34 are formed. Such materials include, but are not limited to, thermally-conductive plastics, filled pastes, and metals. In one embodiment thermal conduits 70 are formed as a solid or unbroken metal (e.g., copper) plane. However, in preferred embodiments, thermal conduits 70 are produced in a predetermined pattern or design. In this regard, a three dimensional printing technique can be employed wherein a thermally-conductive ink is selectively deposited in a predetermined pattern or design. A non-exhaustive list of suitable printing techniques includes inkjet printing, aerosol printing, and needle dispensing techniques. In embodiments wherein such printing processes are employed, thermal conduits 70 can be printed conformally to exposed surfaces of die 30 and the support surface of temporary substrate 80. Thus, as shown in FIG. 3, conduits 70 can be printed to extend over the backside of die 30 (region 72), down the sides of die 30 (regions 74), and away from die 30 along substrate 80 (region 76) to the location at which the package sidewall is subsequently formed during the below-described panel singulation process. Suitable thermally-conductive inks include, but are not limited to, inks containing relatively small metal particles, such as gold or silver particles in the nanometer range (e.g., particles having average diameters ranging from about 2 to about 50 nanometers). The printed ink or other material from which thermal conduits 70 are formed can have a thermal conductivity exceeding 5 watt per meter-Kelvin (W/mK); more preferably exceeding 100 W/mK; and, in certain embodiments, approaching or exceeding 400 W/mK. The thermally-conductive ink can be sintered or otherwise cured after deposition to form thermal conduits 70. In further embodiments, other processes can be utilized to form thermal conduits 70.

Figure 4:
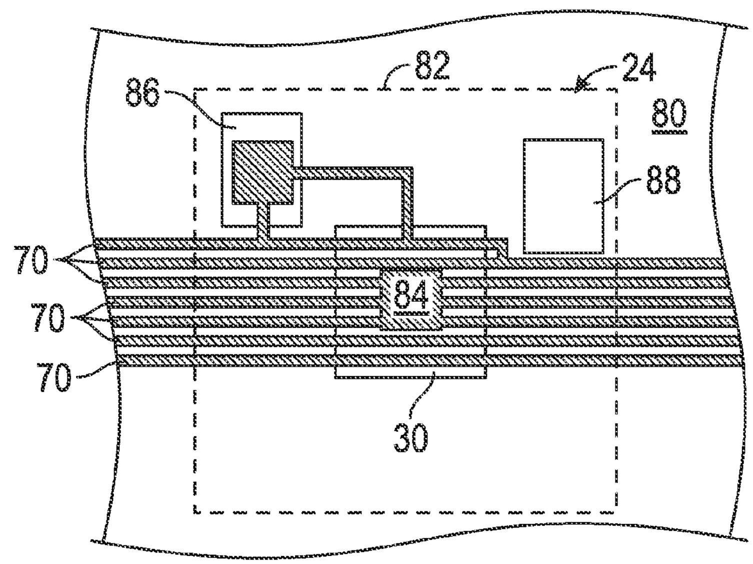

FIG. 4 is a top-down or planform view of semiconductor die 30 and the surrounding portion of temporary substrate 80 after deposition of thermal conduits 70. As noted above, thermal conduits 70 extend laterally from die 30 to the location at which the sidewall of package layer 24 will later be formed by singulation of the below-described molded panel (the outline of the completed microelectronic package 20 is represented in FIG. 4 by dashed box 82). In one embodiment, thermal conduits 70 are deposited as elongated lines or ridges having a predetermined width of, for example, 100 to 200 μm. By forming thermal conduits 70 in this manner, a relatively strong bond interface can be produced between lower package layer 24 and upper package layer 22. Patterning of thermal conduits 70 also enables one or more of the following benefits to be realized. First, thermal conduits 70 can be patterned to include one or more enlarged regions 84 overlying "hot spots" present on semiconductor die 30 prone to heat generation during operation of die 30. Second, thermal conduits 70 can be patterned to extend to other microelectronic components (e.g., component 86 shown in the top left corner of FIG. 4) from which enhanced heat dissipation is desired. Additionally, thermal conduits 70 can be routed through other thermally-conductive structures of larger size, such as an embedded ground plane (e.g., ground plane 190 described below in conjunction with FIG. 13), to further promote conductive heat flow away from die 30. Third, in embodiments wherein conduits 70 are formed from an electrically-conductive material, such as a plated metal or electrically-conductive ink, thermal conduits 70 can be patterned to extend around and thereby avoid undesired electrical bridging to other electrically-conductive interconnect features included within package layer 24 and/or other microelectronic components contained therein, such as component 88 shown in the top right corner of FIG. 4.

After formation of thermal conduits 70, an encapsulation process is carried-out (also commonly referred to as "panelization" or "overmolding"). During the encapsulation, a non-illustrated mold frame having a central cavity or opening therein can be positioned over temporary substrate 80 and around semiconductor die 30, thermal conduits 70, and the other die and thermal conduits 70 supported by substrate 80. An electrically-insulative encapsulant or mold compound, such as a silica-filled epoxy, is dispensed into the cavity of the mold frame. The encapsulant flows over and around semiconductor die 30 and thermal conduits 70. The encapsulant can then be solidified by thermal curing (e.g., heating in a partially-evacuated chamber) to yield a solid panel in which die 30, thermal conduits 70, and the other non-illustrated die and thermal conduits are embedded. The panel is conveniently produced as a relatively thin, disc-shaped body or mass having a generally circular planform geometry; however, the panel body can be fabricated to have any desired shape and dimensions. In other embodiments, the panel can be produced utilizing various other known fabrication techniques including, for example, compression molding, dispense, and lamination processes.

Figure 5:
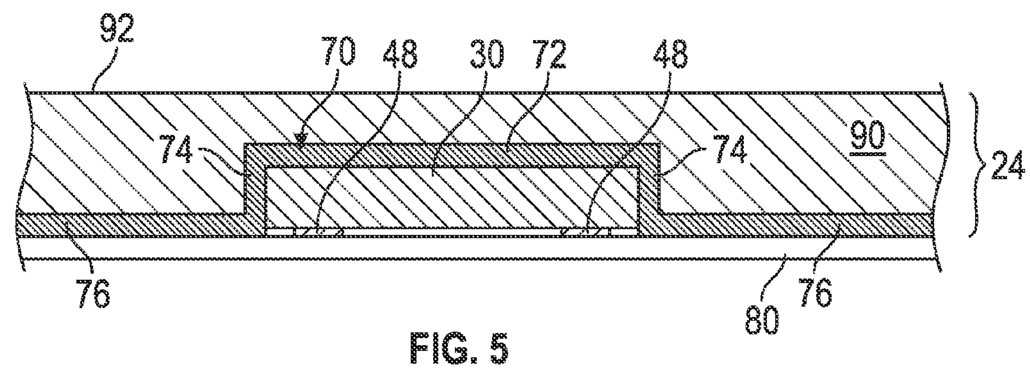
Figure 6:
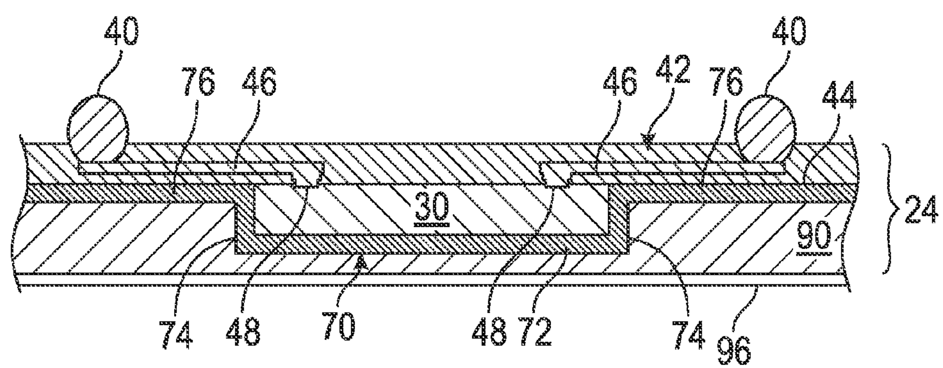

FIG. 5 illustrates a portion of a molded panel 90 produced pursuant to the above-described encapsulation process and encompassing partially-completed package layer 24. While only the portion of molded panel 90 encompassing package layer 24 is shown in FIG. 5 for clarity, it will be understood that molded panel 90 is considerably larger than the illustrated portion and contains other die and thermal conduits similar or identical to those shown in the accompanying figures. After encapsulation, molded panel 90 can be thermally released or otherwise removed from temporary substrate 80 to reveal the frontside of panel 90. Bond pads 48 of semiconductor die 30 are exposed through the frontside of molded panel 90. Molded panel 90 is then inverted and attached to a support structure, such as a ceramic carrier 92 (shown in FIG. 6). With frontside 56 of molded panel 90 now facing upwards, RDLs 42 can be formed over panel 90 by spinning-on or otherwise depositing one or more dielectric layers and forming interconnect lines 46 therein. Interconnect lines 46 can be produced utilizing well-known lithographical patterning and conductive material (e.g., copper) deposition techniques. After build-up of RDLs 42, trenches or openings are formed in the uppermost redistribution layer by lithographical patterning and then BGA solder balls 40 can be deposited in contact with the exposed regions of interconnect lines 46 by bumping. In further embodiments, build-up of RDLs 42 and/or formation of BGA solder balls 40 can occur after panel stacking, as described below in conjunction with FIG. 7.

Figure 7:
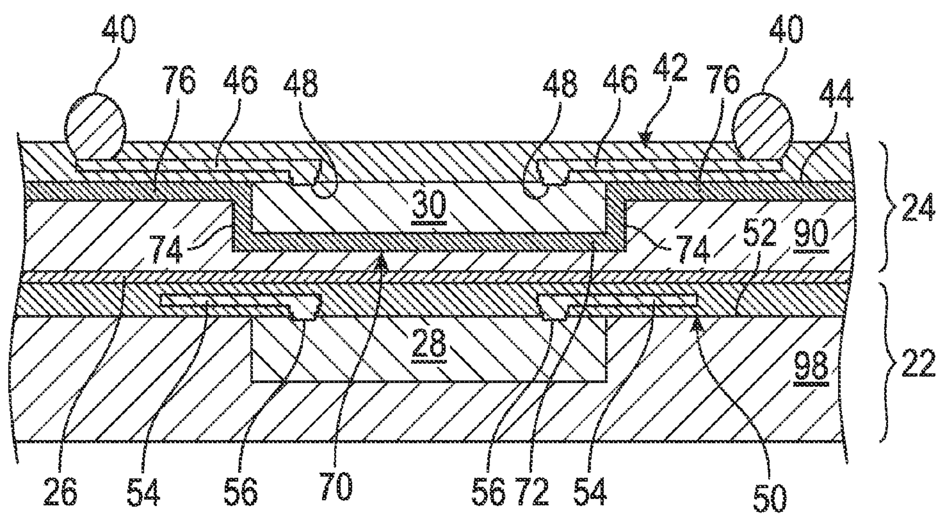

Either prior to or after production of RDLs 42 and BGA solder balls 40, molded panel 90 containing package layer 24 is stacked with a second molded panel containing package layer 22. The molded panels are stacked such that package layers 22 and 24 vertically align, as taken along the package centerline (corresponding to the Z-axis identified in FIGS. 1 and 2 by coordinate legend 38). This may be more fully appreciated by referring to FIG. 7 illustrating molded panel 90 after stacking with a second molded panel 98 containing package layer 22 to yield a two panel stack 90, 98. As indicated above, an adhesive layer 34 can be utilized to bond panels 90 and 98 in the desired stacked position. Molded panel 98 can be produced in essentially the same manner as is molded panel 90 and may or may not contain embedded thermal conduits.

Figure 8:
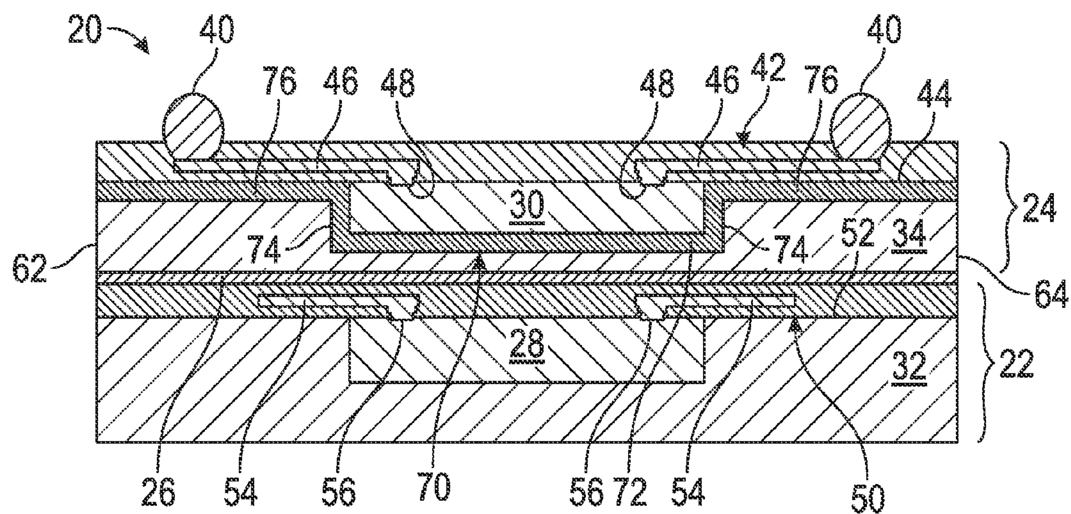

After bonding panels 90 and 98, the resulting panel stack 90, 98 is singulated to separate microelectronic package 20 and the other microelectronic packages into discrete units. Singulation is conveniently carried-out utilizing a dicing saw; however, other singulation processes can also be utilized including, for example, laser cutting. The resultant structure is shown in FIG. 8 wherein the singulated pieces of panels 98 and 90 are identified by reference numerals "32" and "34," respectively, and are referred to herein as "overmold layers." As can be seen, singulation has imparted the body 22, 24 of microelectronic package 20 with substantially vertical sidewalls 62 and 64. The peripheral end regions of thermal conduits 70, which may be partially removed during singulation, extend to and are exposed through package sidewalls 62 and 64. Thus, heat spreader structures 60 can now be formed over selected regions of the package sidewalls 62 and 64 and in contact with the end regions of conduits 70 exposed therethrough, as described below.

As noted above, heat spreader structures 60 can be formed utilizing various different deposition techniques. For example, in certain embodiments, heat spread structures 60 can be produced by plating. In further embodiments, an electrically-conductive paste or solder can be dispensed over sidewalls 62 and 64 and then patterned utilizing, for example, a laser ablation process. However, in preferred embodiments, a three dimension printing process is utilized during which a thermally-conductive ink is dispensed in a desired pattern over the package sidewalls. A non-exhaustive list of suitable printing techniques includes inkjet printing, aerosol printing, and needle dispensing techniques. The thermally-conductive ink can contain relatively small metal particles, such as gold or silver particles in the nanometer range, such as particles having average diameters ranging from about 2 to about 50 nanometers (nm). As was the case previously, the ink or other material from which heat spreader structures 60 are formed can have a thermal conductivity exceeding 5 W/mK; more preferably exceeding 100 W/mK; and still more preferably approaching or exceeding 400 W/mK. More generally, heat spreader structures 60 will be formed from a material having a thermal conductivity exceeding the mold compound from which overmold layers 32 and 34 are produced. Heat treatment can be performed, if needed, to sinter the thermally-conductive ink after printing thereof. If desired, a porous coating can be produced over heat spreader structures 60 after deposition thereof. In certain implementations, a layer of silver oxalate is dispensed over heat spreader structures 60 and then sintered to yield the porous coating, such as coating 68 shown in FIG. 1. In embodiments wherein heat spreader structures 60 are composed of a nanoparticle-containing ink, sintering of the sliver oxalate (or like material) can be performed after sintering of structures 60 or a single sintering process can be employed to simultaneously sinter both structures 60 and coating 68.

The foregoing has thus been described an exemplary embodiment of a stacked microelectronic package 20 including a number of sidewall-deposited heat spreader structures 60 and embedded thermal conduits 70, which enhance the heat rejection capabilities of the package. In particular thermal conduits 70 promote heat transfer from the heat-generating component or components contained with package 20 (e.g., die 30) to the heat spreader structures 60, which then promote release of the heat to the ambient environment. In this manner, heat can be effectively removed from the heat-generating components contained within microelectronic package 20 and, specifically, within lower package layer 24 to improve the overall thermal performance of package 20. Furthermore, in embodiments wherein die 28 generates excess heat during operation, a certain amount of heat transfer can also beneficially occur from die 28, through RDL layers 50 and embedded thermal conduits 70, and to heat spreader structures 60. If desired, heat removal from die 28 can further be enhanced by producing additional thermal conduits in contact with the backside of die 28 and extending to sidewall-deposited heat spreader structures 60, by attaching a copper slug or other heat sink structure to the backside of die 28, or by a combination thereof. In still further embodiments, additional heat spreader structures or a heat sink can be disposed on the backside of package 20 and thermally coupled to sidewall-deposited heat spreader structures 60 to further increase the heat rejection capabilities of package 20.

Figure 9:
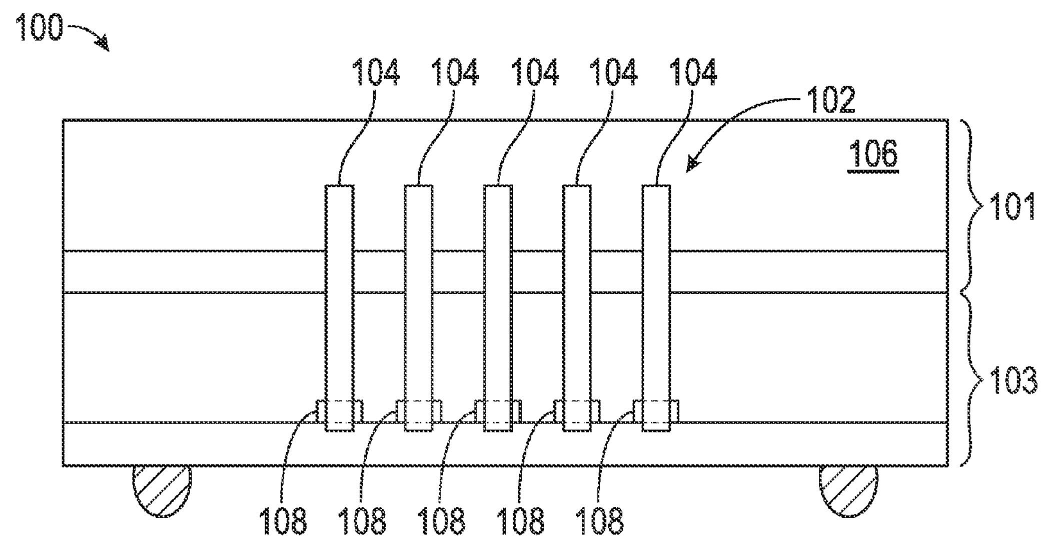
FIGS. 9 and 10 are side views of microelectronic packages illustrating sidewall-deposited heat spreader structures having varying shapes and dispositions.
Figure 10:
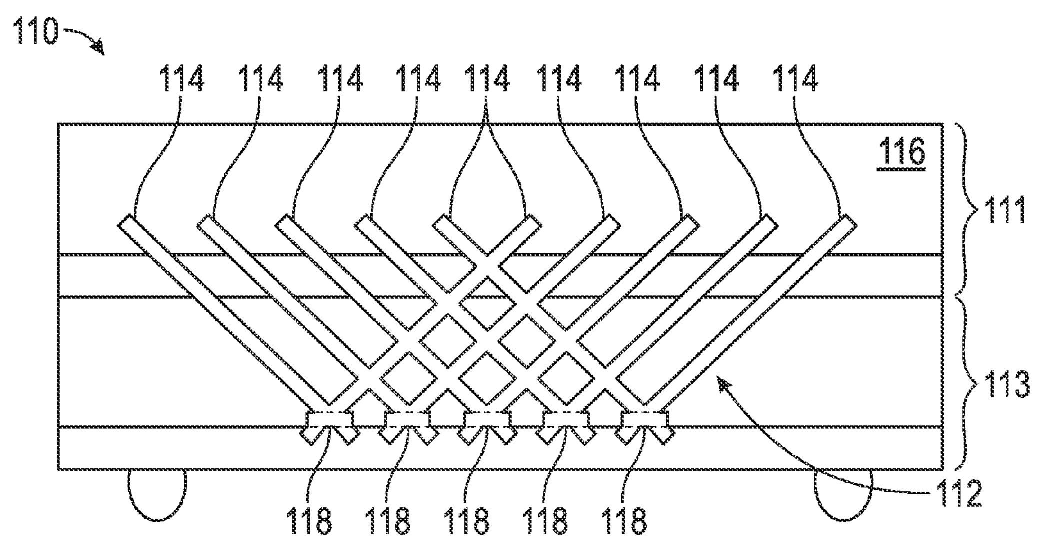

In the above-described exemplary embodiment, heat spreader structures 60 are deposited to include a plurality of fins or spars 66 (identified in FIG. 2) that intersect to form a grid or lattice-like structure. However, in further embodiments, the heat spreader structures may not include spars (or other such projections) or may include spars of varying shapes and dispositions. For example, as indicated in FIG. 9, a microelectronic package 100 can be produced including a heat spreader structure 102 including a number of vertically-extending fins or spars 104, which extend over the outer surfaces of stacked package layers 101 and 103. Spars 104 are laterally spaced along a sidewall 106 of package 100 and each formed in contact with the regions 108 of thermal conduits exposed through sidewall 106. Additional heat spreader structures can also be formed on the other non-illustrated sidewalls of package 100, as desired. Consider further microelectronic package 110 shown in FIG. 10, which includes a heat spreader structure 112 having a number of elongated fins or spars 114 extending over the outer surfaces of stacked package layers 111 and 113. As are spars 104 of package 100 (FIG. 9), spars 114 are formed on a package sidewall 116 in contact with a number of thermal conduits 118 exposed therethrough. However, in this case, spars 114 are formed in an intersecting fan pattern allowing the lengths of spars 114 to be increased. Various other shapes and configurations of heat spreader structures can also be envisioned and modified depending upon application, desired heat dissipation capabilities, package size and shape, and other such factors, such as whether the package will be exposed to forced airflow provided by a neighboring fan when installed within a larger system or device.

Figure 11:
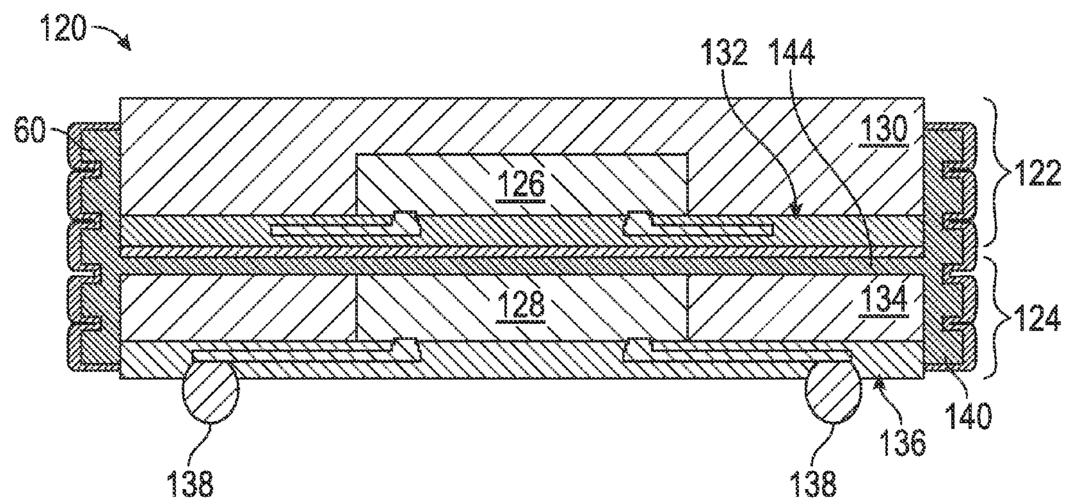
FIG. 11 is a cross-sectional view of a stacked, multi-layer microelectronic package having sidewall-deposited heat spreader structures and embedded thermal conduits, which are deposited after encapsulation and panel thinning, as illustrated in accordance with a further embodiment of the present invention.
Figure 12:
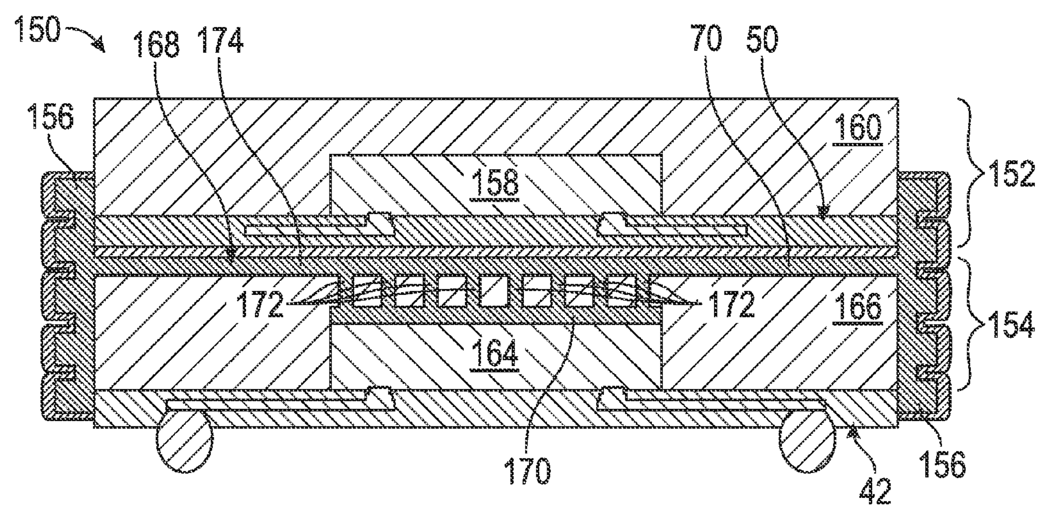
FIG. 12 is a cross-sectional view of a stacked, multi-layer microelectronic package having sidewall-deposited heat spreader structures and embedded thermal conduits, which include regions deposited before and after encapsulation, as illustrated in accordance with a still further embodiment of the present invention.

As can the sidewall-deposited heat spreader structures, the embedded thermal conduits can take various forms suitable for increasing conductive heat flow from those packaged components or regions of the package prone to excess heat generation to the externally-exposed heat spreader structures. Furthermore, the thermal conduits can be produced by a combination of thermally-conductive features embedded within the package body. FIGS. 11 and 12 are cross-sectional views of microelectronic packages 120 and 150, respectively, containing thermal conduits of varying types. Describing first microelectronic package 120 (FIG. 11), microelectronic package 120 includes stacked package layers 122 and 124, which contain semiconductor die 126 and 128, respectively. Upper package layer 122 further includes an encapsulant or overmold layer 130 in which die 126 is embedded, as well as a number of RDLs 132 produced over layer 130 and die 126. Lower package layer 124 likewise includes an overmold layer 134 having a number of RDL layers 136 formed thereover A BGA 138 is produced over RDL layers 136, and heat spreader structures 140 are formed on opposing package sidewalls 142. Microelectronic package 120 is further produced to include at least one embedded thermal conduit 144, which contacts and extends from the backside of die 30, across the fan-out region of overmold layer 134, and to heat spreader structures 140. The layer defining embedded thermal conduits 144 can be a solid plane or a patterned layer composed of a thermally-conductive material, as described below. Embedded thermal conduits 144 thus cooperate with sidewall-deposited heat spreader structures 140 to conductively remove heat from die 30 during operation and then transfer the heat to the surrounding environment. As an additional benefit, the overall height of package 120 is minimized due to the reduced thickness of package layer 134.

Microelectronic package 120 can be produced utilizing a fabrication process similar to that described above in conjunction with microelectronic package 20 (FIGS. 1-8). However, as opposed to thermal conduits 70 described above in conjunction with package 20 (FIGS. 1-8), embedded thermal conduits 144 (FIG. 11) are formed after the overmolding or panelization process utilized to encapsulate die 128 and produce overmold layer 134. During package fabrication of package 120, die 128 is first encapsulated within a molded panel. The molded panel will typically initially cover the backside of die 128 and is consequently thinned to reveal the backside of semiconductor die 30 therethrough. A grinding, lapping, or Chemical-Mechanical Polishing (CMP) can be utilized during panel thinning Subsequent to panel thinning, embedded thermal conduits 144 are formed over the backside surface of the panel and in contact with the newly-exposed backside of die 30. As noted above, thermal conduits 144 can be formed as a solid or unbroken metal (e.g., copper) plane, which can be plated or otherwise deposited over the panel. However, in preferred embodiments, thermal conduits 144 are deposited in a predetermined pattern or design by plating, printing, lamination, or another deposition process. Additionally, as thermal conduits 144 are planar in the embodiment shown in FIG. 11, conduits 144 can be deposited utilizing a silk screen process. In still further embodiments, thermal conduits 144 can be formed by positioning one or more discrete structures, such as one or more pieces of metal or patterned foil, over the planarized backside of the panel. Fabrication of microelectronic package 120 can be then be completed utilizing steps described above in conjunction with package 20 (FIGS. 1-8).

Turning to microelectronic package 150 shown in FIG. 12, it will be noted that package 150 is similar to package 120 is many respects. For example, package 150 includes an upper package layer 152, a lower package layer 154 underlying upper package layer 152, and sidewall-deposited heat spreader structures 156 formed on opposing sidewalls of package 150. Upper package layer 152 includes, in turn, a semiconductor die 158 embedded within a overmold layer 160. So too does lower package layer 154 include a die 164 embedded within a overmold layer 166. Furthermore, as was previously the case, package 150 includes one or more embedded thermal conduits 168, which contact and extend from die 164 to heat spreader structures 156. However, in the embodiment shown in FIG. 12, embedded thermal conduits 168 are made-up of three regions: (i) a base region 170 formed on the backside of die 164, (ii) a number of vertically-extending column regions 172, which project from base region 170 in a direction away from die 164, and (iii) horizontally-extending region 174, which join and extend laterally away from column regions 172 to heat spreader structures 156. During fabrication of package 150, base region 170 can be deposited over die 164 prior to the encapsulation process utilizing, for example, a three dimensional printing process of the type described above. The three dimensional printing process can also be utilized to form column regions 172 as vertically-freestanding columns projecting upwardly from base region 170. As previously indicated, embedded thermal conduits 168 can be produced from any of the candidate materials identified above as suitable for usage in fabricating the heat spreader structures. Overmolding can then be carried-out to produce a molded panel containing die 164, base region 170, and column regions 172. If column regions 172 are covered by encapsulant overburden pursuant to overmolding, the panel backside can be thinned to reveal column regions 172 therethrough. Afterwards, horizontally-extending region 174 can be formed over the backside of the panel and in contact with column regions 172 by plating, silk screening, printing, or utilizing another deposition process, such as those described above in conjunction with thermal conduits 144 (FIG. 11). Process steps similar to those described above can then be performed to complete fabrication of package 150.

Figure 13:
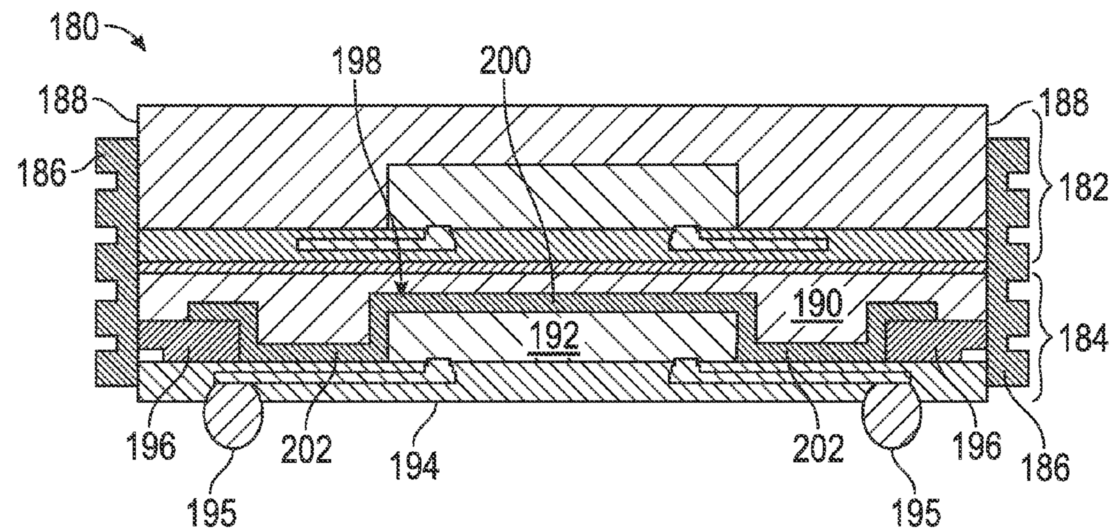
FIGS. 13 and 14 are side and top-down cross-sectional views, respectively, of a microelectronic package having at least one sidewall-deposited heat spreader structure, embedded thermal conduits, and an embedded ground plane thermally coupled between the heat spreader structure and the embedded thermal conduits, as illustrated in accordance with a still further embodiment of the present invention.
Figure 14:
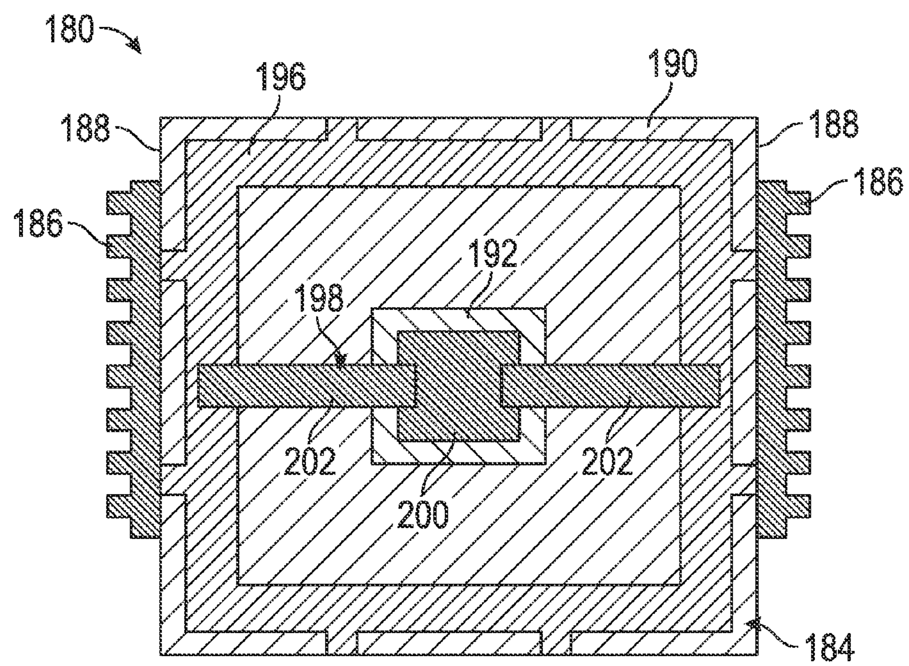

As noted above, embodiments of the microelectronic package can include embedded thermal conduits routed through or to other thermally-conductive structures contained within the package body. Consider, for example, FIGS. 13 and 14 illustrating in planform and side cross-sectional views, respectively, a microelectronic package 180 including an upper package layer 182 (FIGS. 13 and 14), a lower package layer 184 (FIG. 14), and a number of sidewall-deposited heat spreader structures 186 formed on package sidewalls 188 (FIGS. 13 and 14). Describing specifically lower package layer 184, package layer 184 includes an encapsulant or molded layer 190, a semiconductor die 192 contained layer

190, and a number of RDLs 194 formed over molded layer 190, and a BGA 195 formed over RDLs 194. An Embedded Ground Plane (EGP) 196 and an embedded thermal conduit 198 are further contained within molded layer 190. EGP 196 extends around the perimeter of die 190 and is composed of a thermally- and electrically-conductive metal or alloy, such as copper. Embedded thermal conduit 198 includes an enlarged central region 200, which is formed on the backside of die 190 (shown most clearly in FIG. 14). Thermal conduit 180 also includes two laterally-extending regions 202, which extend from central region 200, along the sidewalls of die 192, under RDLs 194, and to EGP 196. By virtue of this design, excess heat generated by die 190 during usage of package 180 is conducted through thermal conduit 198, distributed across the mass of EGP 196, and at least partially transferred to sidewall heat spreader structures 186 for convective dissipation to the surrounding ambient environment. Thus, in effect, EGP 196 serves as a relatively large heat spreader structure and an extension of thermal conduit 198 to further improve the heat dissipation capabilities of package 180 in conjunction with sidewall-deposited heat spreader structures 186.

There has thus been provided embodiments of microelectronic packages and methods for fabricating microelectronic packages having improved heat dissipation capabilities. Heat dissipation is improved by printing or otherwise depositing heat spreader structures onto the package sidewalls, which enhance convective heat release to the surrounding environment. If desired, the heat spreader structures can be produced include fins or spars to increase the surface area thereof available for convective cooling. Additionally or alternatively, a porous coating can be deposited depositing over the exterior of the heat spreader structures. Embodiments of the above-described packages are also advantageously produced to include embedded thermal conduits to promote conductive heat transfer to the heat spreader structure from the packaged semiconductor die or other microelectronic components prone to excess heat generation. The embedded thermally-conductive conduits can be patterned to include enlarged regions overlying die hot spots, to avoid electrical bridging to neighboring microelectronic components and interconnect structures, or to preferentially route the conduits through an EGP or other such thermally-conductive structure to further promote heat removal from the die. Notably, the above-described microelectronic packages provide enhanced thermal performance even when containing multiple package layers bonded in a stacked relationship, one or more of which can be encapsulated utilizing a FO-WLP approach. The foregoing has also provided embodiments of a fabrication method for producing such packages able to be performed, at least in large part, on a panel level to maximize throughput and enhance manufacturing efficiency.

In one embodiment, the package fabrication method includes the step or process of providing a package body containing a microelectronic device. A heat spreader structure is deposited (e.g., printed) onto or otherwise formed on at least one sidewall of the package body. The heat spreader structure is thermally coupled to the microelectronic device and is configured to dissipate heat generated thereby during operation of the microelectronic package. In preferred embodiments, at least one thermal conduit is also embedded within the microelectronic package and thermally couples the heat spreader structure to the microelectronic device.

In a further embodiment, the fabrication method includes embedding a thermal conduit in a first package layer containing a semiconductor die such that the thermal conduit contacts a backside of the semiconductor die. The first package layer is then bonded to the second package layer in a stacked relationship such that the backside of the semiconductor die faces the second package layer. A heat spreader structure is then formed on the microelectronic package and thermally couples to the semiconductor die through the thermal conduit embedded in the first package layer.

In a still further embodiment, a microelectronic package is provided including a package body, a microelectronic component contained within the package body, and a first heat spreader structure deposited over a first sidewall of the package body and thermally coupled to the microelectronic component contained therein. In certain cases, a thermal conduit can be embedded within the package body to thermally couple the microelectronic component to the first heat spreader structure. The microelectronic devices can assume the form of a semiconductors die having a backside contacted by the thermal conduit. Additionally, in some implementations, the package body can include: (i) a first package layer containing the microelectronic component and having one or more redistribution layers formed thereover; and (ii) a second package layer bonded to the first package layer and facing the backside of the semiconductor die, the thermal conduit located between the redistribution layers and the second package layer. In yet further embodiments, the package body includes an overmold layer having a fan-out region surrounding the microelectronic component, in which case the first heat spreader structure can be deposited in contact with an external surface of the fan-out region. If desired, a second heat spreader structure can further be deposited over a second sidewall of the package body opposite the first sidewall of the package body.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating a microelectronic package, comprising:

providing a package body including an overmold layer in which a semiconductor die is embedded, the overmold layer having a fan-out region surrounding the semiconductor die;

forming a thermal conduit contained within the package body and extending from a backside of the semiconductor die, at least partially across the fan-out region, and toward a first sidewall of the package body; and depositing a heat spreader structure onto the first sidewall of the package body, the heat spreader structure thermally coupled to the semiconductor die through the thermal conduit and configured to dissipate heat generated thereby during operation of the microelectronic package.

2. The method of claim 1 wherein forming a thermal conduit comprising printing the thermal conduit from a thermally-conductive ink.

3. The method of claim 1 wherein the overmold layer has backside and an opposing frontside through which the semiconductor die is exposed, wherein the method further comprises producing one or more redistribution layers over the frontside of the overmold layer after formation of the thermal conduit.

4. The method of claim 1 wherein depositing the heat spreader structure comprises:

printing thermally-conductive ink onto a sidewall of the package body; and sintering the thermally-conducive ink to form the heat spreader structure.

5. The method of claim 1 wherein the heat spreader structure is deposited to include a plurality of spars projecting laterally away from the package body.

6. The method of claim 1 further comprising forming a porous coating over the heat spreader structure having a porosity exceeding the porosity of the material from which the heat spreader structure is formed.

7. The method of claim 1 wherein the microelectronic package comprises first and second package layers bonded in a stacked relationship, and wherein forming comprises forming the heat spreader structure in contact with the first and second package layers.

8. The method of claim 1 wherein providing a package body comprises:

embedding the semiconductor die and the thermal conduit in a molded panel; and singulating the molded panel to define the package body and to partially remove a peripheral end region of the thermal conduit.

9. The method of claim 1 wherein providing a package body comprises:

placing the semiconductor die on a temporary substrate;

forming the thermal conduit in contact with the semiconductor die and the temporary substrate;

overmolding the semiconductor die and the thermal conduit to yield a molded panel; and singulating the molded panel to define the package body.

10. The method of claim 9 wherein forming comprises depositing the thermal conduit to have a first portion in contact with the backside of the semiconductor die, a second portion in contact with a sidewall of the semiconductor die, and a third portion in contact with the temporary substrate.

11. The method of claim 9 wherein forming the thermal conduit comprises forming a plurality of thermal conduits in contact with the semiconductor die and the temporary substrate, the plurality of thermal conduits formed as a number of elongated thermally-conductive traces composed of a thermally-conductive ink printed onto the semiconductor die and the temporary substrate.

12. The method of claim 1 wherein depositing the heat spreader structure comprises printing a thermally-conductive ink onto the at least one sidewall in a predetermined pattern.

13. A method for fabricating a microelectronic package, comprising:

forming a thermal conduit in contact with a backside of a semiconductor die contained within a first package layer, the first package layer including a first overmold layer in which the semiconductor die is embedded;

bonding the first package layer to a second package layer in a stacked relationship such that the backside of the semiconductor die faces the second package layer and such that the first and second package layers combine to form a package body, the second package layer containing a microelectronic component embedded within a second overmold layer; and depositing a heat spreader structure onto a sidewall of the package body, the heat spreader structure contacting the first overmold layer, contacting the second overmold layer, and thermally coupled to the semiconductor die through the thermal conduit.

14. The method of claim 13 wherein the embedded thermal conduit includes an end portion exposed at the sidewall prior to deposition of the heat spreader structure, and wherein the heat spreader structure is deposited in contact with the end portion of the thermal conduit.

15. The method of claim 13 wherein the first package layer is bonded to the second package layer while both the first and second package layers are in panel form to yield a panel stack, and wherein the method further comprises singulating the panel stack to yield the package body and define the sidewall onto which the heat spreader structure is subsequently deposited.

16. A microelectronic package, comprising:

a package body including a first overmold layer having a fan-out region;

a semiconductor die embedded within the first overmold layer and surrounded by the fan-out region;

a thermal conduit embedded within the first overmold layer and extending from a backside of the semiconductor die, at least partially across the fan-out region, and toward a first sidewall of the package body; and a first heat spreader structure deposited onto the first sidewall of the package body and thermally coupled to the semiconductor die through the thermal conduit.

17. The microelectronic package of claim 16 wherein the package body comprises:

a first package layer including the first overmold layer and further including one or more redistribution layers formed over the first overmold layer; and a second package layer bonded to the first package layer and facing the backside of the semiconductor die, the thermal conduit located between the redistribution layers and the second package layer.

18. The microelectronic package of claim 16 wherein the first heat spreader structure is deposited in contact with an external surface of the fan-out region.

19. The microelectronic package of claim 16 further comprising a second heat spreader structure deposited over a second sidewall of the package body opposite the first sidewall of the package body.

20. The microelectronic package of claim 16 wherein the thermal conduit comprises:

a first region contacting the backside of the semiconductor die;

a second region contacting a sidewall of the semiconductor die; and a third region extending laterally away from the semiconductor die and at least partially through the fan-out region.

* * * * *